United States Patent [19]
Chi

[11] Patent Number: 6,025,625
[45] Date of Patent: Feb. 15, 2000

[54] SINGLE-POLY EEPROM CELL STRUCTURE OPERATIONS AND ARRAY ARCHITECTURE

[75] Inventor: Min-hwa Chi, Hsinchu, Taiwan

[73] Assignee: Worldwide Semiconductor Manufacturing Corporation, Hsinchu, Taiwan

[21] Appl. No.: 09/258,083

[22] Filed: Feb. 25, 1999

[51] Int. Cl.[7] .................................................. H01L 29/788
[52] U.S. Cl. ......................... 257/315; 257/299; 257/300; 257/312
[58] Field of Search ................................. 257/315, 299, 257/300, 312

[56] References Cited

U.S. PATENT DOCUMENTS 5,828,095 10/1998 Merritt ..................................... 257/299
5,960,283 9/1999 Sata ......................................... 438/257

*Primary Examiner*—Sheila V. Clark
*Assistant Examiner*—H. D. Tran
*Attorney, Agent, or Firm*—Blakely Sokoloff Taylor & Zafman

[57] ABSTRACT

A single-poly EEPROM cell comprising an inverter and a capacitive coupling area. The inverter is formed by: a p-well formed in a substrate; a gate structure formed atop the p-well and being formed from a thin gate oxide layer underneath a conductive layer; an n-base formed adjacent to a first edge of the gate structure and within the p-well; a p+ structure formed within the n-base; and a n+ structure adjacent a second edge of the gate structure and within the p-well. The capacitive coupling area is formed from a second p-well formed in the substrate and a floating gate, the floating gate formed from the conductive layer and capacitively coupled to the second p-well.

10 Claims, 7 Drawing Sheets

SINGLE-POLY EEPROM CELL STRUCTURE OPERATIONS AND ARRAY ARCHITECTURE

FILED OF THE INVENTION

The present invention generally relates to electrically erasable programmable read only memory (EEPROM), and more particularly, to a EEPROM that can be made with a single polysilicon layer and operate on low voltage.

BACKGROUND OF THE INVENTION

Single poly EEPROM is widely used as nonvolatile memory for embedded applications in CMOS logic and mixed signal circuits. The single poly EEPROM cell is fully compatible with standard single poly CMOS processes and it is often called "zero cost" EEPROM.

A conventional prior art EEPROM cell is shown in FIGS. 1–3. A large n-well 103 serves as a "control gate" for the EEPROM cell because it is capacitively coupled to the floating gate which is formed from a layer of polysilicon. The p+ region 105 near the edge of the floating gate is shorted with the n+ well contact 107. This allows the n-well surface beneath the floating gate to be easily inverted during programming operation. The n-channel transistor (seen in cross section of FIG. 3) is used for the read operation and its threshold voltage is modulated by the presence or absence of electron charge on the floating gate. By this method, digital information can be stored in the EEPROM cell.

The cell can be programmed (electrons injected onto the floating gate) using the well known channel hot electron (CHE) injection by applying approximately 10–12 volts at the control gate ($V_{cg}$) and approximately 6 volts at the drain of the n-channel transistor. After programming, the cell threshold voltage increases from about 1.5 volts to 7 volts. Thus, for read operation, by applying 5 volts on the control gate and approximately 1 volt at the drain, the cell is either "off" or "on" representing the digital information "0" or "1", respectively.

One difficulty with this prior art cell is that relatively high voltages are necessary to operate the EEPROM cell. The prior art is also large in size. What is needed is a low voltage single poly EEPROM cell with small size.

SUMMARY OF THE INVENTION

A single-poly EEPROM cell comprising an inverter and a capacitive coupling area. The inverter is formed by: a p-well formed in a substrate; a gate structure formed atop said p-well and being formed from a thin gate oxide layer underneath a conductive layer; an n-base formed adjacent to a first edge of said gate structure and within said p-well; a p+ structure formed within said n-base; and a n+ structure adjacent a second edge of said gate structure and within said p-well. The capacitive coupling area is formed from a second p-well formed in said substrate and a floating gate, said floating gate formed from said conductive layer and capacitively coupled to said second p-well.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is a single poly EEPROM cell that uses a novel inverter and a coupling capacitor. The inverter used is disclosed in U.S. patent application Ser. No. 09/177,787 entitled "CMOS Inverter Using Gate Induced Drain Leakage Current" assigned to the same assignee herein and incorporated be reference.

The inverter is one of the most fundamental elements in digital integrated circuits. The inverter is a single input, single output digital device. If a "1" is input to the input of the inverter, the output of the inverter will be a "0". Conversely, if a "0" is input to the input of the inverter, the output of the inverter will be a "1". The inverter used in the present invention will first be described and then the architecture of the single-poly EEPROM cell will be described.

Figure 1:
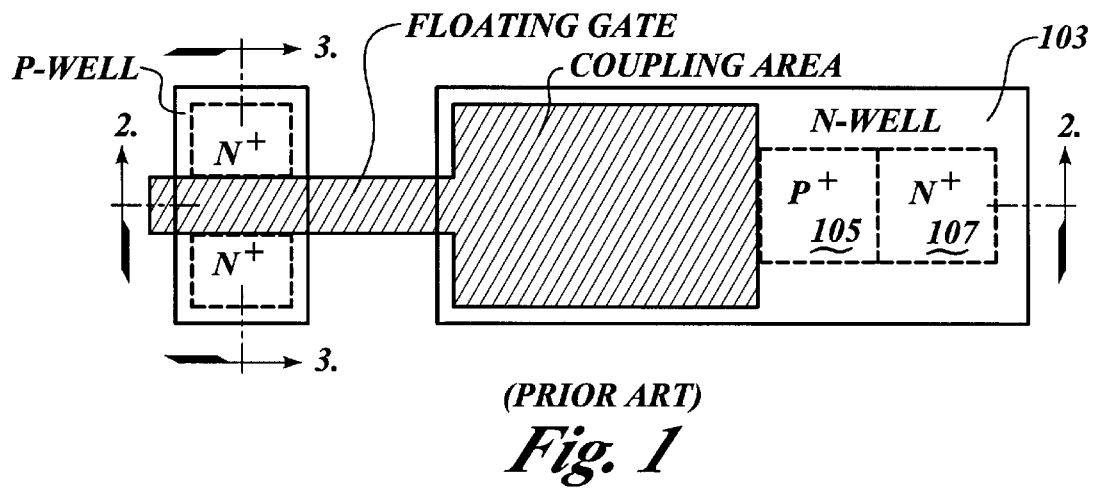
FIG. 1 is a schematic diagram of a prior art single poly EEPROM cell.
Figure 2:
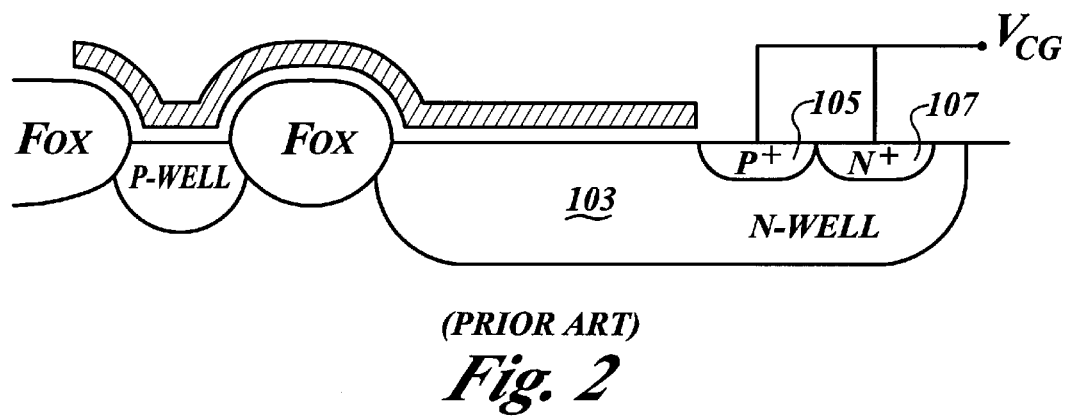
FIG. 2 is a cross section view of the cell of FIG. 1 along line A-A'.
Figure 3:
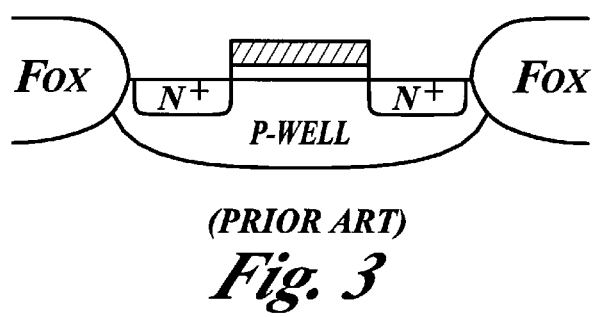
FIG. 3 is a cross section view of the cell of FIG. 1 along line B-B'.
Figure 4:
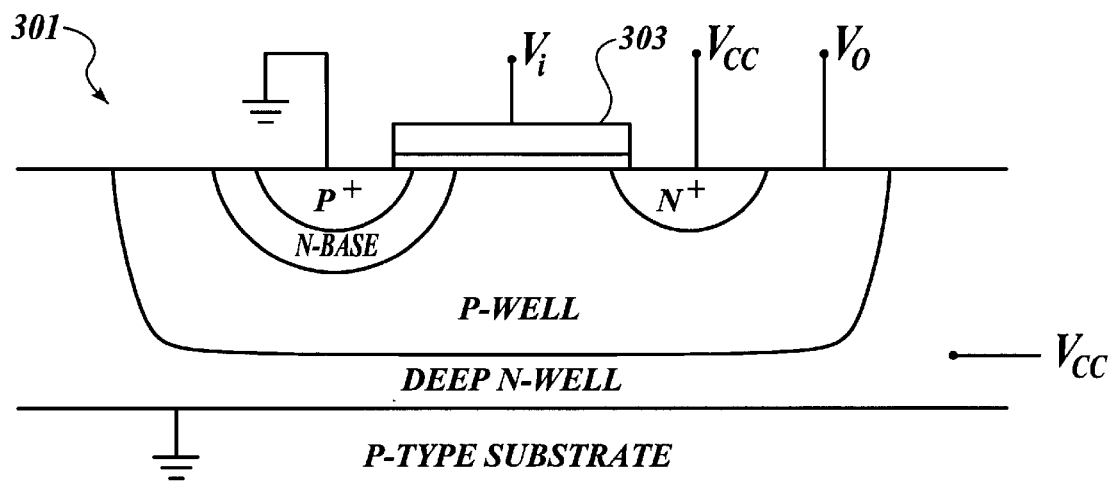
FIG. 4 is a cross-section view of a semiconductor substrate having formed therein a p-well CMOS inverter in accordance with the present invention.

A preferred embodiment of the inverter is shown in FIG. 4, wherein a p-type substrate is used as the foundation for the formation of a CMOS inverter 301. Then an isolation region (not shown in FIG. 4) is formed by well-known methods of local oxidation (LOCOS) or shallow trench isolation (STI). Formed in the p-type substrate is a deep n-well. Preferably, the deep n-well is formed by ion implantation using conventional masking and ion implantation methods. The deep n-well is preferably approximately 3 microns deep and has a dopant concentration of approximately $10^{15}/cm^3$.

Next, a p-well is formed in the deep n-well using conventional masking and ion implantation technology. The p-well is preferably approximately 1.5 microns deep and has a dopant concentration of $10^{16}/cm^3$.

Next, a gate oxide layer is formed over the substrate. The gate oxide is typically a thin silicon dioxide layer formed by thermal oxidation. Formed atop the gate oxide layer is an in situ doped polysilicon layer. The layer of polysilicon and the layer of gate oxide is then patterned and etched to form a gate structure 303.

After formation of the gate structure 303, an n-base is formed within the p-well. The n-base is self aligned to one edge of the gate structure 303. Preferably, the n-base is formed using conventional diffusion techniques or by a combination of ion implantation and thermal diffusion. As will be seen below, this allows a single mask to be used to form the n-base and the p+ structure. The thermal diffusion allows the n-base to expand laterally so that it extends underneath the gate structure 303. After diffusion, the n-base has a depth of about 0.7 microns and has a dopant concentration of about $10^{17}/cm^3$. Preferably, the dopant is phosphorous.

Next, a p+ structure is formed within the n-base and is self aligned to one edge of the gate structure 303. The same mask may be used to form the p+ structure as is used to form the n-base. The p+ structure preferably is formed using ion implantation to a depth of 0.3 microns and having a dopant concentration of $10^{20}/cm^3$. Preferably, the dopant used is boron. Notice that the n-base physically separates the p+ region and the p-well.

Formed adjacent to the other edge of the gate structure 303 is an n+ structure. The n+ structure is formed in the p-well and is self aligned to the gate structure 303. Preferably, the n+ structure has a depth of 0.3 microns and has a dopant concentration of $10^{20}/cm^3$.

Note that each of the manufacturing steps described above are commonly used in a CMOS process for forming prior art transistors. Therefore, the inverter of the present invention can be easily integrated into the process for forming standard CMOS transistors.

Finally, conventional methods are used to form contacts and interconnect to the various structures in the inverter 301. For example, the p+ structure and the p-type substrate are connected to ground (or more generically $V_{ss}$). The gate structure 303 is connected to an input terminal $V_i$. The n+ structure and the deep n-well are connected to a biasing voltage $V_{cc}$. Finally, the p-well is electrically connected to the output terminal $V_o$.

In operation, when the input bias $V_i$ is high (or approximately $V_{cc}$), electrons are generated on the surface of the p+ structure by band-to-band tunneling. These band-to-band tunneling generated electrons will flow into the n-base region (which is at a higher potential than the p+ structure) and pull down the n-base potential as well as the p-well potential to near ground. Similarly, when the input bias $V_i$ is low (approximately ground), holes are generated on the surface of the n+ structure by band to band tunneling. These band to band tunneling generated holes will flow into the p-well region (which is at a lower potential than the n+ structure) and pull up the p-well potential to approximately $V_{cc}$. Thus, the p-well potential is set by the above mechanism and is the opposite polarity to the input $V_i$.

Several points should be made of the inverter 301 of FIG. 4. First, the n-base should have a dopant concentration that is high enough so that there is no MOS action in the parasitic n-MOS or p-MOS. The p-well is floating and it serves as the output of the inverter 301. Moreover, there is no lightly doped drain (LDD) structure process needed, e.g. an LDD implant (phosphorous for n-type and boron for p-type), followed be spacer layer deposition and etch-back. Therefore, the surface of the n+ structure and the p+ structure can generate holes and electrons, respectively, by band-to-band tunneling (BBT). This, in turn, will result in gate-induced drain leakage (GIDL) current and will operate to change the potential of the p-well.

The GIDL current typically occurs in thin gate oxide MOS devices and is between the drain and the substrate. The basis of the GIDL current is band-to-band tunneling that occurs on the surface of the gate to drain overlap region. Additional information on GIDL current may be found in "Design for Suppression of Gate-Induced Drain Leakage in LDD MOSFET's Using a Quasi 2 Dimensional Analytical Model," by Parke et al., IEEE Transactions on Electron Devices, Vol. 39, No. 7, July 1992, pp. 694 1702. In that article, the authors explain that the surface of an n+ region underneath a gate edge experiences a high vertical electrical field (from the gate bias) that results in hole generation on the surface of an n+ region underneath the gate by band to band tunneling in the n+ region.

It should also be noted that the inverter 301 can be fabricated by a process that is fully compatible with standard CMOS processes. Specifically, all of the process steps described above to form the inverter 301 are commonly used in a CMOS process flow for the formation of transistors. Additionally, the inverter 301 is much smaller than a conventional CMOS inverter. Also important, there is no DC power consumption if the output is connected to the next stage by capacitive coupling. This is particularly useful for SRAMs, where there is no need of "local interconnect" technology.

Figure 5:
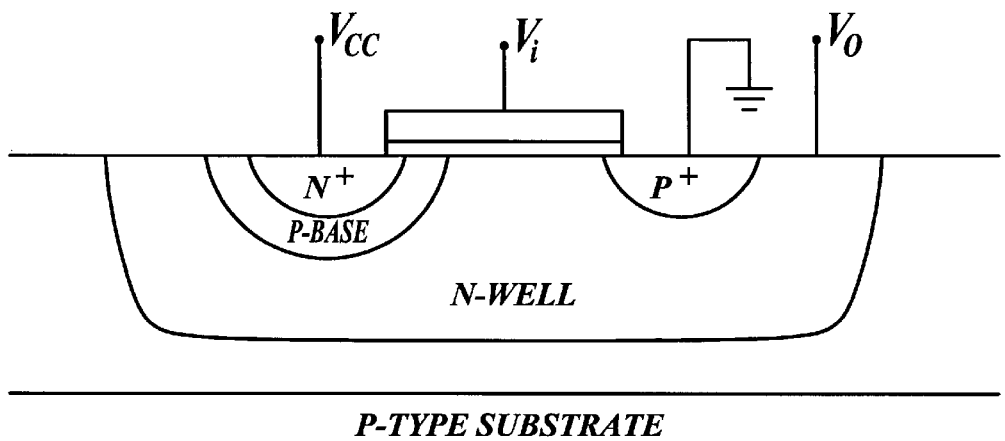
FIG. 5 is a cross-section view of a semiconductor substrate having formed therein an n-well CMOS inverter in accordance with the present invention.

By inverting the polarities of the conduction type and biases, a corresponding new inverter structure with an n-well as the output node may be manufactured. Such a device is shown in FIG. 5. Contacts and interconnects are formed to the various structures in the inverter 301. For example, the p+ structure and the p-type substrate are connected to ground (or more generically $V_{ss}$). The gate structure 303 is connected to an input terminal $V_i$. The n+ structure is connected to a biasing voltage $V_{cc}$. Finally, the n-well is electrically connected to the output terminal $V_o$.

For this embodiment, when the input bias $V_i$ is high (or approximately $V_{cc}$), electrons are generated on the surface of the p+ structure by band to band tunneling. These band to band tunneling generated electrons will flow into the n-well region (which has a higher potential than the p+ structure) and pull down its potential to approximately ground. Similarly, when the input bias is low (approximately ground), holes are generated on the surface of the n+ structure by band to band tunneling. These band to band tunneling generated holes will flow into the n-well region (which has a lower potential than the n+ structure) and pull up its potential to approximately $V_{cc}$. Thus, the n-well potential as set by the above mechanism and is the opposite to the input $V_i$.

Figure 6A:
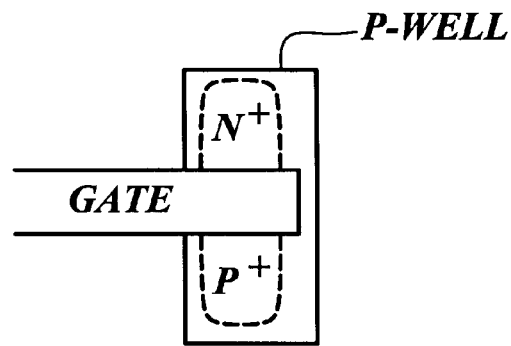
FIG. 6A is a top layout view of a p-well CMOS inverter in accordance with the present invention.
Figure 6B:
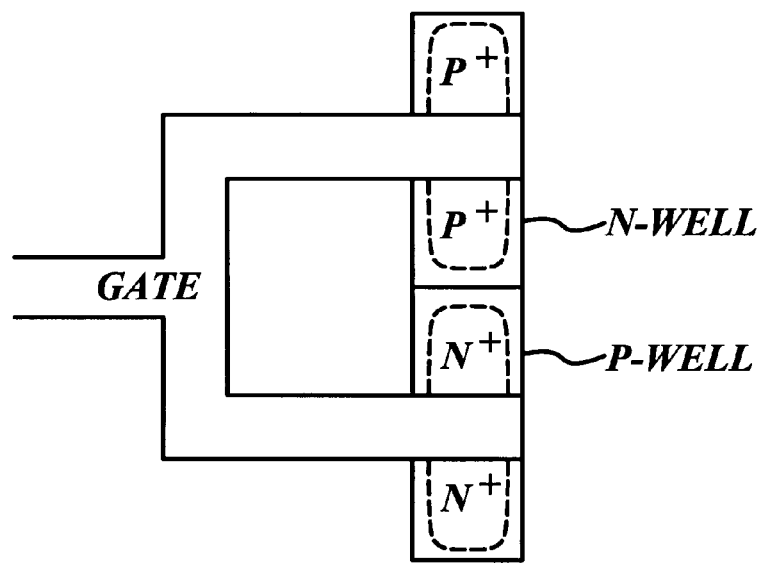
FIG. 6B is a top layout view of a prior art CMOS inverter.

A comparison of the layout implementation of a conventional prior art inverter and the inverter 301 of the present invention is shown in FIGS. 6A and 6B. As can be seen, the new inverter in accordance with the present invention is approximately 50 percent smaller than a conventional CMOS inverter.

Figure 7:
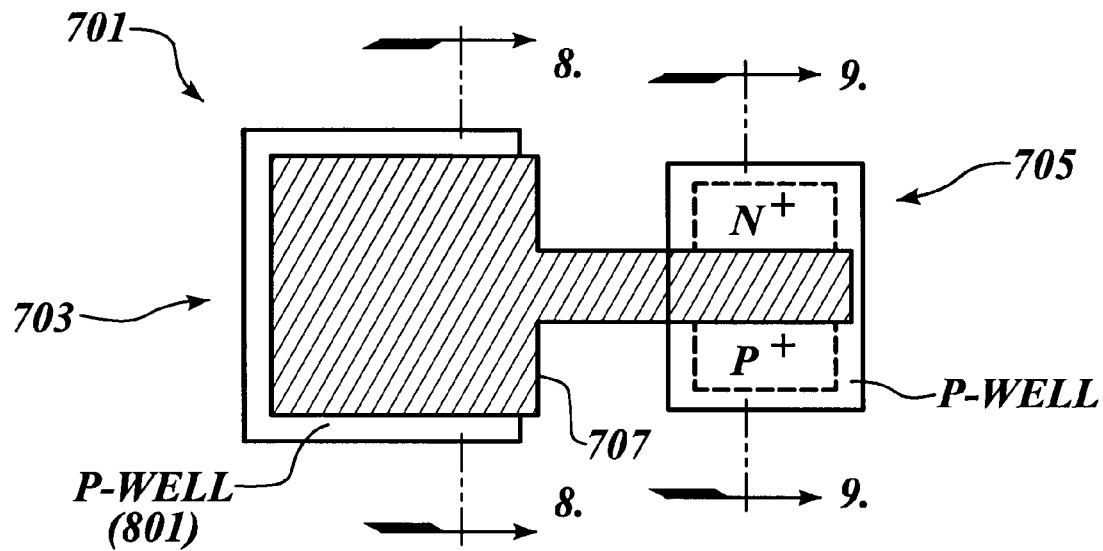
FIG. 7 is a top layout view of a EEPROM cell formed in accordance with the present invention.
Figure 8:
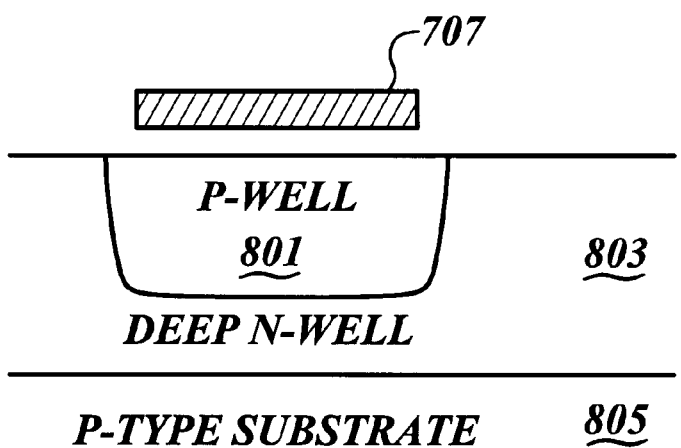
FIG. 8 is a cross section view of the cell of FIG. 7 taken along line A-A'.
Figure 9:
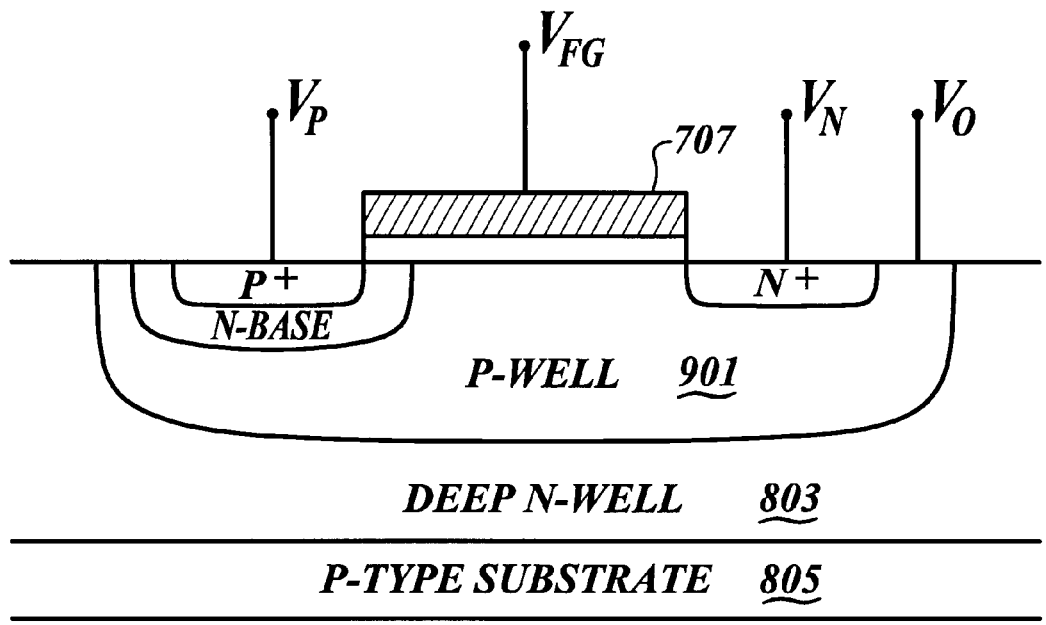
FIG. 9 is a cross section view of the cell of FIG. 7 taken along line B-B'.

Turning to FIGS. 7–9, an EEPROM cell 701 in accordance with the present invention is shown in top layout form (FIG. 7) and in various cross sections (FIGS. 8 and 9). The EEPROM cell 701 comprises a capacitive coupling area 703 connected to a CMOS inverter 705 formed in accordance with FIGS. 4–6 and the above description. The gate of the inverter is formed from conductive polysilicon and is also referred to as a floating gate 707. The capacitive coupling area 703 is simply a p-well formed underneath the floating gate 707 and separated by a dielectric layer.

FIG. 8 shows a cross sectional view taken along line A-A' of FIG. 7. Preferably, the p-well 801 is formed within a deep n-well 803 which in turn is formed in a p-type substrate 805. FIG. 9 shows a cross sectional view taken along line B-B' of the inverter of FIG. 7. FIG. 9 is substantially similar to FIG. 4 and also shows the deep n-well 803 and the p-type substrate 805. The floating gate 707 is electrically connected to the floating gate 707 that overlays the p-well 801 in the capacitive coupling area 703. As in the inverter shown in FIG. 4, the output of the inverter 705 is the p-well 901 and is designated by $V_o$. The voltage applied to the n+ junction inside p-well 901 of FIG. 9 is designated $V_n$ and the voltage applied to the p+ junction inside the n-base is designated $V_p$. Finally, the potential of the floating gate 707 is designated $V_{fg}$.

Figure 10:
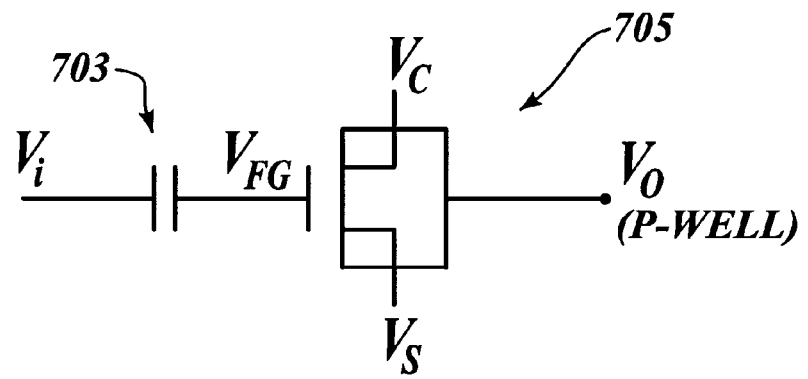
FIG. 10 is a schematic illustration of a proposed electrical device notation for the EEPROM cell of FIG. 7.

FIG. 10 shows a device notation for the present invention that is proposed by the inventor. As can be seen, the capacitive coupling area 703 is shown merely by a capacitor symbol and the inverter 705 has as its output the p-well $V_o$.

Figure 11:
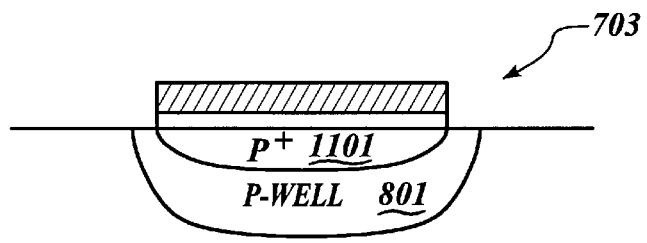
FIG. 11 is a cross section view of an EEPROM cell in accordance with an alternative embodiment of the present invention.

FIG. 11 shows an alternative embodiment of the present invention taken along line A-A' of FIG. 7. In this embodiment, a p+ region 1101 is formed within the p-well 801 that is underneath the capacitive coupling area 703. The p+ region 1101 can be used to eliminate surface depletion or inversion during operation of the EEPROM cell so that the coupling capacitance between the p-well and the floating gate is more linear and larger in magnitude.

Figure 12:
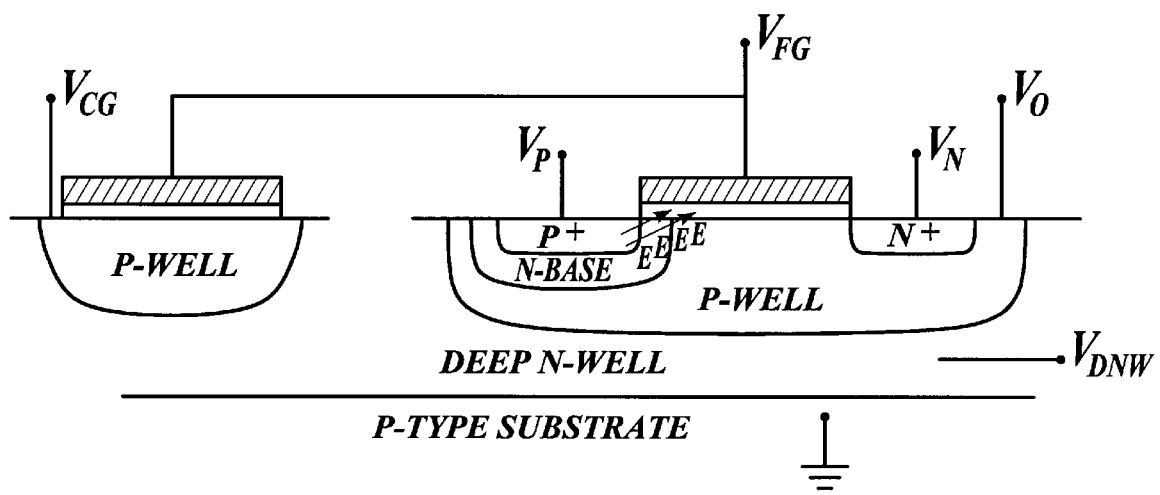
FIG. 12 is a schematic illustration of the EEPROM cell of FIG. 7 during a write operation.

FIG. 12 shows the preferred biasing scheme for programming or writing a "1" to the EEPROM cell. As seen in FIG. 12, the p-well of the capacitor is biased at $V_{cg}=V_{cc}$. The p+ region inside the n-base of the inverter is biased at $V_p=-V_{cc}$. The n+ region inside the p-well of the inverter is biased at $V_n=V_{cc}$ or left floating. The p-well of the inverter is biased at $V_{pw}=V_{cc}$. The deep n-well is biased at $V_{dnw}=V_{cc}$. The p-type substrate is grounded. Under this biasing, the floating gate $V_{fg}$ has a voltage of approximately $0.8 \times V_{cc}$. This assumes that a coupling ratio of 0.8 exists at a large enough capacitive coupling region 703. Typically, the capacitive coupling region is designed to be about ten times larger than the gate area in the inverter. In this case, the coupling ratio from the p-well coupling node $V_{cg}$ is approximately 0.8. Note that the coupling ratio is defined as $C_i/C_{tot}$ where $C_{tot}$ is the total capacitance viewed from the floating gate, and $C_i$ is the capacitance of the capacitive coupling area.

Under these bias conditions, electrons are generated by band to band tunneling on the surface of the p+ region of the inverter. The band to band tunneling electrons gain energy from the voltage drop across the p+/n-base/p-well junction and hot electrons will be injected into the floating gate with high efficiency. The injection process of the electrons will continue, until the floating gate potential ($V_{fg}$) approaches 0 volt at the end of the programming step. The net charge on the floating gate is therefore negative by $V_{cc} \times C_i$.

Note that the surface of the p-well in the capacitive coupling area 703 is in accumulation mode. Also note that there is negligible bipolar action in the p+/n-base/p-well structure in the inverter, since the p-well to n-base junction has very low injection efficiency.

Figure 13:
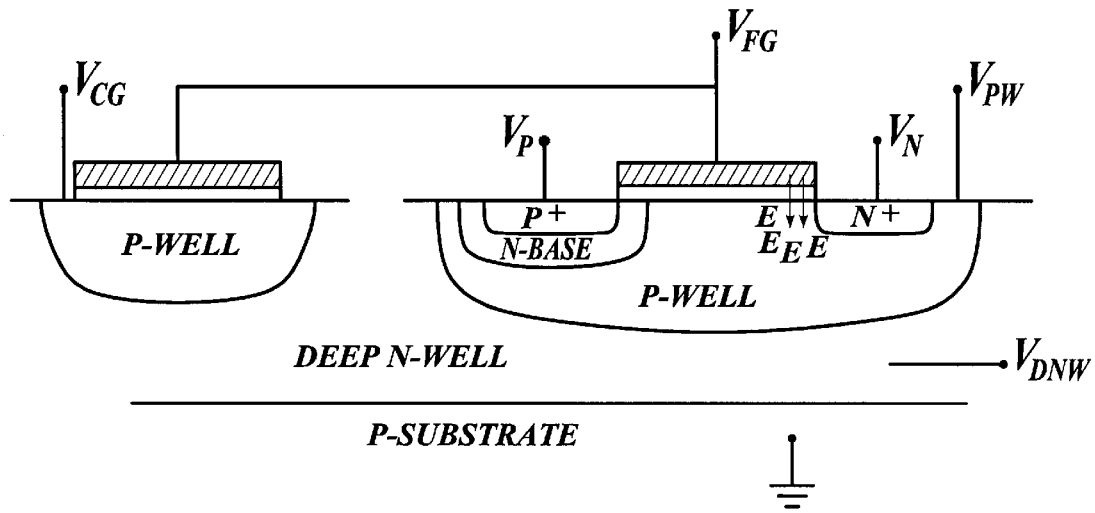
FIG. 13 is a schematic illustration of the EEPROM cell of FIG. 7 during an erase operation.

Turning next to FIG. 13, the EEPROM of the present is shown during the erase or write "0" operation. This operation is based on the Fowler-Nordheim tunneling of electrons from the floating gate into the p-well and n+ region of the inverter. The preferred bias scheme for the erase operation is: $V_p=-V_{cc}$, $V_n=V_{cc}$, $V_{cg}=-V_{cc}$, and $V_{pw}=V_{cc}$. The floating gate potential $V_{fg}$ is about $-0.8 \times V_{cc}$ when there is no net electrons on the floating gate, and assuming the coupling ratio from the coupling gate to the floating gate is 0.8. The floating gate potential will be more negative than $-0.8 \times V_{cc}$ by $Q_e/C_{tot}$ if there is a net electron charge ($Q_e$) on the floating gate. In this way, there is large enough electrical field (approximately 10 MVolts/cm) for Fowler-Nordheim tunneling mechanism to be established between the floating gate and the p-well (and n+ region of the inverter). Electrons on the floating gate will tunnel toward the n+ region and the surface of the p-well in the inverter. This process will continue until the floating gate potential approaches 0 volt at the end of the erase. The Fowler-Nordheim tunneling current will decrease exponentially with the electrical field, and is negligible when the tunneling field is about 7 MVolts/cm or less. The net charge on the floating gate at the end of the erase operation is close to 0 or slightly positive.

Note that the surface of the p-well in the coupling area may be slightly in depletion or in inversion mode due to the bias applied. This results in reduced effective coupling capacitance due to the series capacitance associated with the depletion layer or inversion layer. Therefore, as noted above, a buried p+ implant can eliminate this drawback and maintain the effective coupling ratio high enough (see FIG. 11). Also note that there is negligible bipolar action in the p+/n-base/p-well structure during erase, since the p-well has very low injection efficiency.

In order to read the EEPROM cell, various operational biases must be applied. The digital information in the EEPROM cell is represented by the "negatively" charged (in the case of a logic "1") or neutral (corresponding to the logic "0") floating gate. The preferred reading operation biases are: $V_{cg}=V_{cc}$, $V_p=0$ volt, and $V_n=V_{cc}$. During the reading of a "1", the floating gate potential is near 0 volt (due to the combined effect of positive potential coupling from $V_{cg}$ and negative potential by the electron charge in the floating gate). Holes are generated on the surface of the n+ region of the inverter by band-to-band tunneling and flow into the p-well of the inverter to pull up the p-well potential to $V_{cc}$.

During reading of a "0", the floating gate potential is near $V_{cc}$ (due to positive potential coupling from $V_{cg}$ and negligible charge in the floating gate). There are electrons generated on the surface of the p+ well in the inverter by band to band tunneling and the electrons flow into the n-base and p-well to pull down the p-well potential to 0 volt.

By reading the output of the p-well ($V_{pw}$), it can be determined whether a logical "0" or a logical "1" is stored in the EEPROM cell. If the voltage of the p-well $V_{pw}$ is $V_{cc}$, then a "0" is stored in the EEPROM cell. However, if the voltage output by the p-well $V_{pw}$ is 0 volt, then a "1" is stored in the EEPROM cell.

Figure 14:
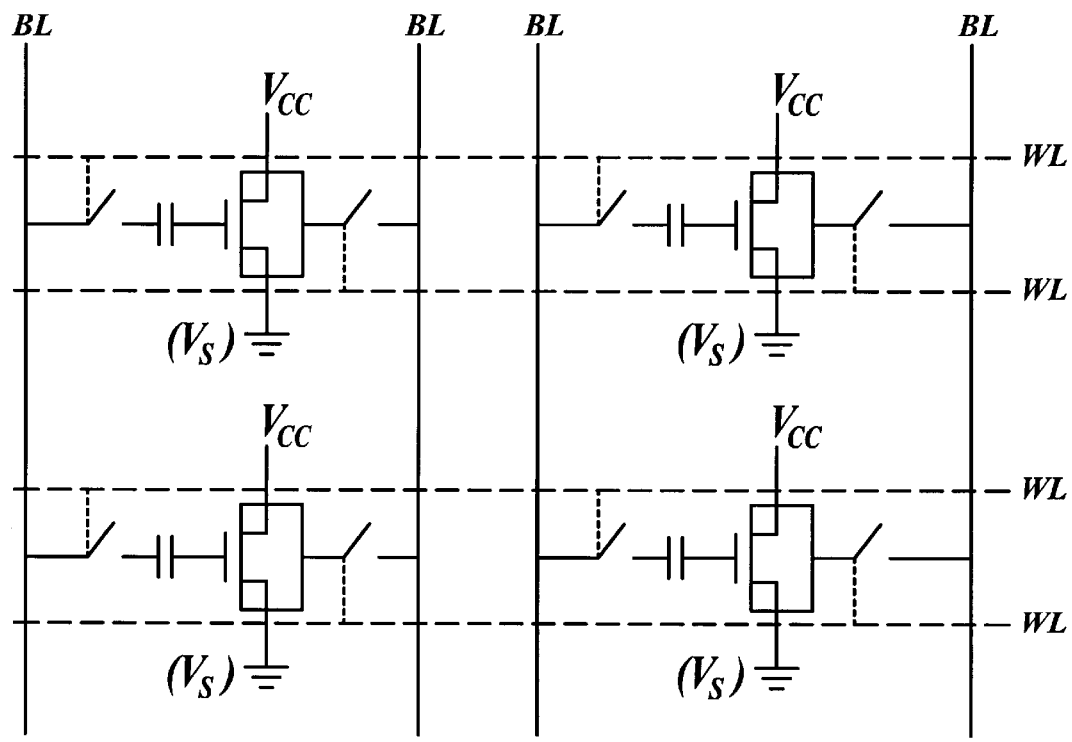
FIG. 14 is a schematic illustration of an array of EEPROM cells formed in accordance with the present invention.

The EEPROM cell as described above can be organized into arrays, as shown in FIG. 14. The coupling p-well in the capacitively area 703 and the output p-well in the inverter are connected to the bitlines BL through parasitic p-channel MOS transistors (shown as switches in FIG. 14). The wordlines WL serve as the gates of the p-channel MOS switches. Each cell is therefore to connected to two bitlines and two wordlines. The $V_n$ of each cell is connected to $V_{cc}$, the $V_p$ is connected to $V_{ss}$ during all operations, where $V_{ss}$ is nominally ground.

During programming and erase operations, $V_{ss}$ is biased to $-V_{cc}$ and during read operation, $V_p$ is biased to 0 volt. Based on this array, each cell can be individually programmed or erased, or read by selected wordlines and bitlines of the cell. Other nonselective cells will be in "inhibit" mode by biasing nonselected wordlines to 0 volt (to open or disconnect the p-channel MOS switches from the cells) and biasing nonselected bitlines to 0 volt or float. It is also easily to be seen that this array is suitable for row operation of program erase and read with the data input or output through the bitlines.

Although in the preferred embodiment, a p-well inverter is used to describe the EEPROM cell, an n-well inverter can function equally well and is not provided here for clarity.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A single-poly EEPROM cell comprising:
   an inverter comprising:
      a p-well formed in a substrate;
      a gate structure formed atop said p-well and being formed from a thin gate oxide layer underneath a conductive layer;
      an n-base formed adjacent to a first edge of said gate structure and within said p-well;
      a p+ region formed within said n-base; and
      a n+ region adjacent a second edge of said gate structure and within said p-well; and
   a capacitive coupling area, said capacitive coupling area being formed from a second p-well formed in said substrate and a floating gate, said floating gate formed from said conductive layer and capacitively coupled to said second p-well.

2. The EEPROM cell of claim 1 further wherein said second p-well has formed within itself a second p+ region.

3. The EEPROM cell of claim 1 wherein said cell is programmed by biasing said second p-well, said p-well, and said n+ region to a voltage $V_{cc}$ and said p+ region to $-V_{cc}$.

4. The EEPROM cell of claim 1 wherein said cell is erased by biasing said second p-well and said p+ region to a voltage $-V_{cc}$ and said p-well and said n+ region to $V_{cc}$.

5. The EEPROM cell of claim 1 wherein said cell is read by biasing said second p-well and said n+ region to a voltage $V_{cc}$ and grounding said p+ region.

6. A single-poly EEPROM cell comprising:
   an inverter comprising:
      an n-well formed in a substrate;
      a gate structure formed atop said n-well and being formed from a thin gate oxide layer underneath a conductive layer;
      a p-base formed adjacent to a first edge of said gate structure and within said p-well;
      an n+ region formed within said p-base; and
      a p+ region adjacent a second edge of said gate structure and within said n-well; and
   a capacitive coupling area, said capacitive coupling area being formed from a second n-well formed in said substrate and a floating gate, said floating gate formed from said conductive layer and capacitively coupled to said second n-well.

7. The EEPROM cell of claim 6 further wherein said second n-well has formed within itself a second n+ structure.

8. The EEPROM cell of claim 6 wherein said cell is programmed by biasing said second n-well, said n-well, and said p+ region to a voltage $V_{cc}$ and said n+ region to $-V_{cc}$.

9. The EEPROM cell of claim 6 wherein said cell is erased by biasing said second n-well and said n+ region to a voltage $-V_{cc}$ and said n-well and said p+ region to $V_{cc}$.

10. The EEPROM cell of claim 6 wherein said cell is read by biasing said second n-well and said p+ region to a voltage $V_{cc}$ and grounding said n+ region.

* * * * *